United States Patent [19]

Geren

[11] Patent Number: 4,800,983

[45] Date of Patent: Jan. 31, 1989

[54] ENERGIZED ACOUSTIC LABYRINTH

[76] Inventor: David K. Geren, 4601 Gloria Ave., Encino, Calif. 91436

[21] Appl. No.: 2,812

[22] Filed: Jan. 13, 1987

[51] Int. Cl.[4] .................... H05K 5/00

[52] U.S. Cl. .................... 181/155; 181/141; 181/148; 381/160

[58] Field of Search .................... 181/141, 148, 155, 176, 181/191, 286; 381/160, 154, 159

[56] References Cited

U.S. PATENT DOCUMENTS

| | | | |
|---|---|---|---|
| 2,848,058 | 8/1958 | Hartsfield | 181/176 |
| 3,957,134 | 5/1976 | Daniel | 181/176 |
| 4,156,476 | 5/1979 | Matsumoto et al. | 181/286 X |
| 4,164,631 | 8/1979 | Garner et al. | 181/176 X |
| 4,322,578 | 3/1982 | Selmin | 381/160 |
| 4,436,179 | 3/1984 | Yamamoto et al. | 181/286 X |

*Primary Examiner*—B. R. Fuller

*Attorney, Agent, or Firm*—Harry R. Lubcke

[57] ABSTRACT

Acoustic wave "diffractor" labyrinth(s) are positioned obliquely in front of sound producing transducer(s) to cause very wide angle dispersion of the sound waves projected from said transducer(s) into said labyrinths. The labyrinths may consist of a complex of bent and folded chambers. This system causes depolarization of the sound waves projected from the transducer(s).

2 Claims, 4 Drawing Sheets

ENERGIZED ACOUSTIC LABYRINTH

SUMMARY OF THE INVENTION

An acoustic labyrinth comprised of a large plurality of parallel channels of varying lengths, with the entrances to the channels being in oblique alignment respective to the source(s) of sound energy. The acoustic labyrinth is configured so as to "diffract" and disperse the sound waves uniformly and to spread the sound evenly in front of the labyrinth, in all three axes.

The labyrinth is capable of causing such "diffraction" of waves because the labyrinth is made up of a plurality of chambers each having its own resonant frequency. Because of the frequencies selected for the chambers and their relative positions, wave interference patterns are generated across the face of the labyrinth which in turn cause the "diffraction" effect.

The sound wave projected into the labyrinth typically originates from a moving diaphragm (a "transducer") which is energized by an electric source. Hence, sound emanates from such a source as polarized waves. Because of the diffraction effect of the labyrinth, the radiated sound is substantially depolarized. In a practical system, two or more "transducers" are required in order to obtain a sufficiently wide range of frequency reproduction for high quality audio reproduction. In an ordinary system without any such labyrinth, these two or more transducers will interact with each other because the sound waves projected are polarized, causing substantial peaks and nodes in the net waveform amplitudes as the sound from each source project into the listening area. By using one or more labyrinths to diffract the sound emanating from the transducers, such interactions are substantially reduced while, at the same time, wide angle dispersion of the sound is obtained.

In the past, the angular dispersion problem has been addressed with the use of Acoustic Lens systems (Garner at al., U.S. Pat. No. 4,164,631; W. L. Hartsfield, U.S. Pat. No. 2,848,058) and an Acoustic Refractor (Daniel, U.S. Pat. No. 3,957,134). These systems can increase dispersion, but they do not de-polarize the sound waves. Furthermore, they tend to be acoustically inefficient and may present the transducer which is driving them with a nonlinear loading impedance.

DETAILED DESCRIPTION OF THE PREFERRED EMBODIMENT

Most loudspeaker systems have transducers which consist of electrically driven diaphragms (transducers) mounted over holes cut into boxes of varying sizes and configurations. These conventional loudspeaker systems usually directly radiate out into the listening area. Hence, they suffer from two major problems: (a) The sound waves emanating from the loudspeakers have a strong tendency to have a diminishing angle of radiation from the center axis of the transducer(s) as the frequency being reproduced rises; and (b) The sound waves are polarized thereby causing wavefronts emanating from two or more transducers in the overall system to interact with each other causing peaks and nodes in amplitude in the listening environment.

In the present system, a superior angle of dispersion is obtained with the use of the labyrinth systems (1, 2, and 8). Dispersion, within their respective frequency ranges, is very great. Dispersion angles of up to seventy-five degrees from the projected transducer axes (9) [150 degrees total] are readily obtained. The dispersion angles obtained, within the frequency ranges for which the diffracting apparatus is designed, are uniform.

The diffracting system has the further attribute of causing the sound waves being emanated to be de-polarized. Wave mechanics physics dictates that polarized waves, sharing the same plane of polarization, will strongly interact with each other when combined. Hence, even if the two interacting polarized waves are of two different frequencies, they will modulate each other. By depolarizing the waves, this inter-modulation will be minimized. The benefits, among others, are that: in multiple transducer loudspeaker systems the transducers will not significantly cross-modulate each other; the buildup of standing waves in the listening room is reduced; and, when two or more diffracting speaker systems are used simultaneously (such as with stereo systems) the speaker systems will not modulate each other.

Figure 1:
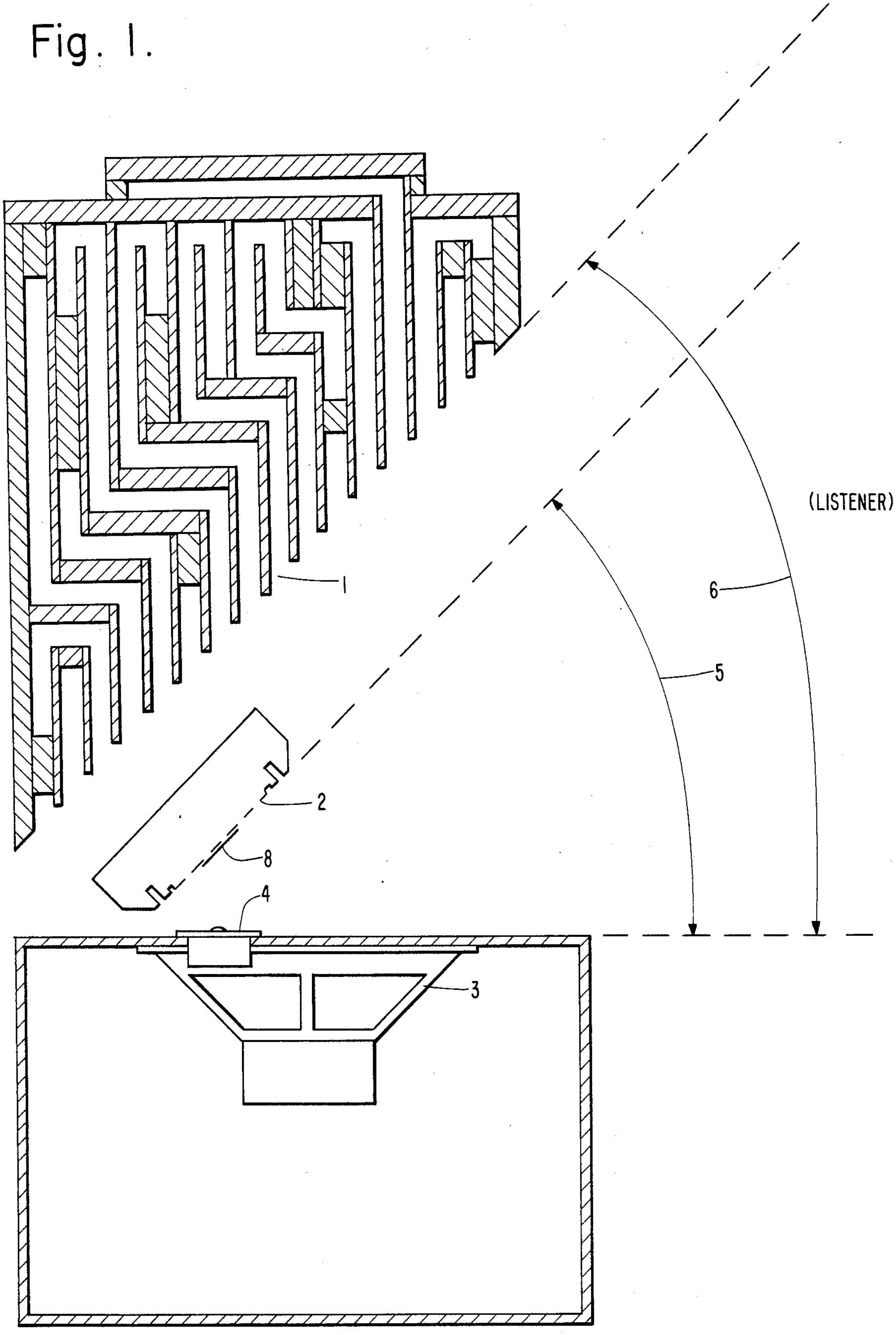
FIG. 1 shows a side sectional elevation view of the invention, the embodiment of which contains a plurality of transducers (3 and 4) and a plurality of labyrinths (1 and 2) placed at angles (5 and 6) to transducers 3 and 4.
Figure 2:
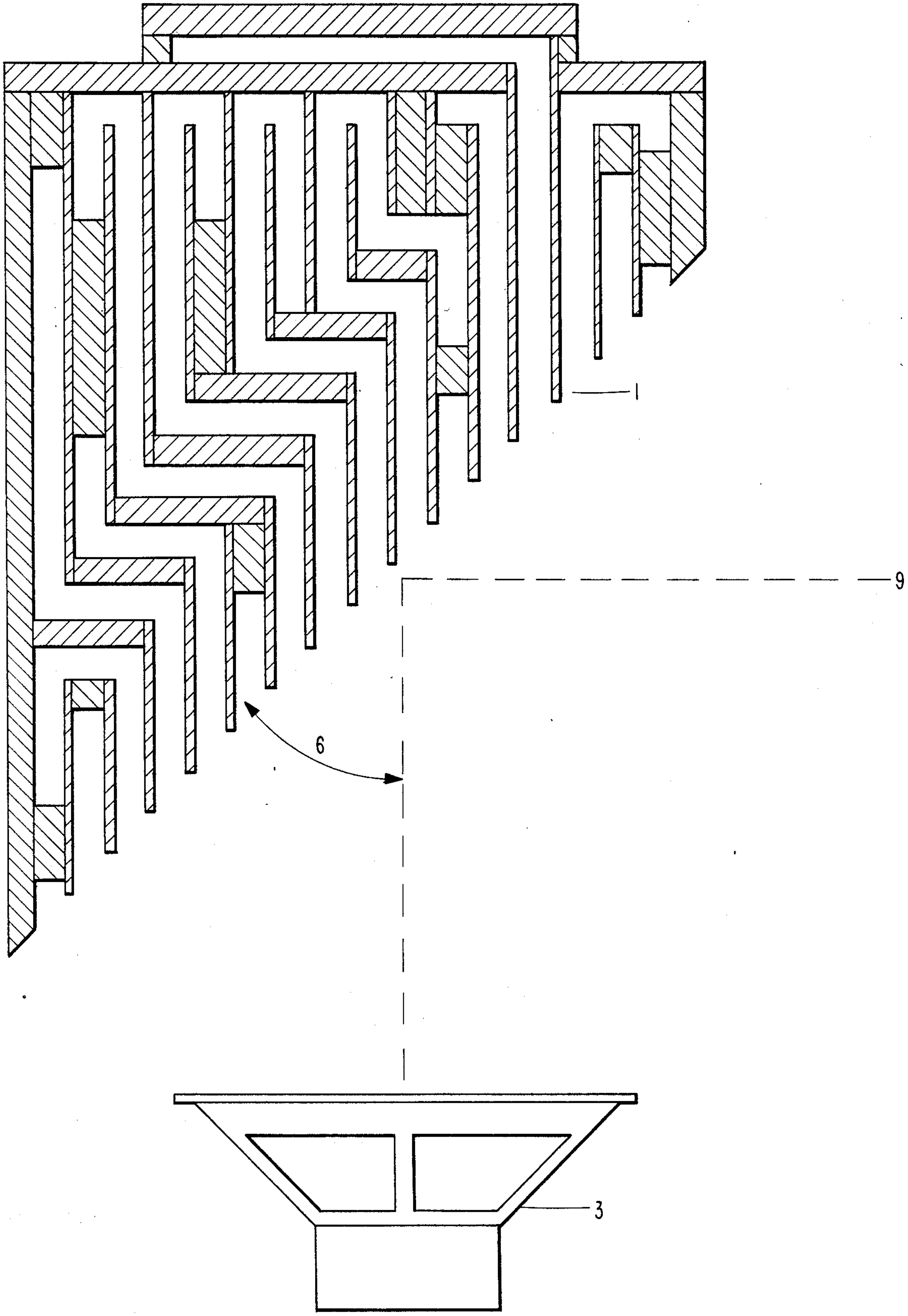
FIG. 2 shows a detailed sectional elevation view of the labyrinth (1) forming the construction shown in FIG. 1.
Figure 3:
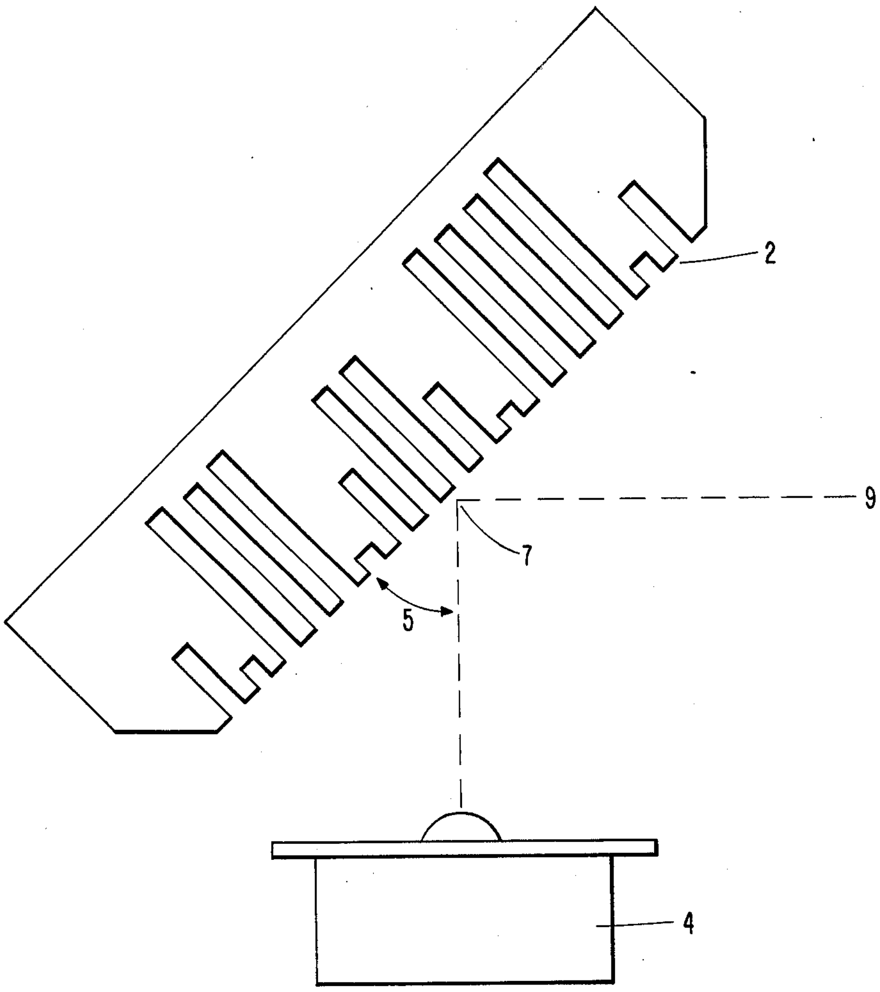
FIG. 3 shows a detailed sectional view of the labyrinth (2) for the high frequency transducer (a "tweeter") in the preferred relationship to said transducer (4)
Figure 4:
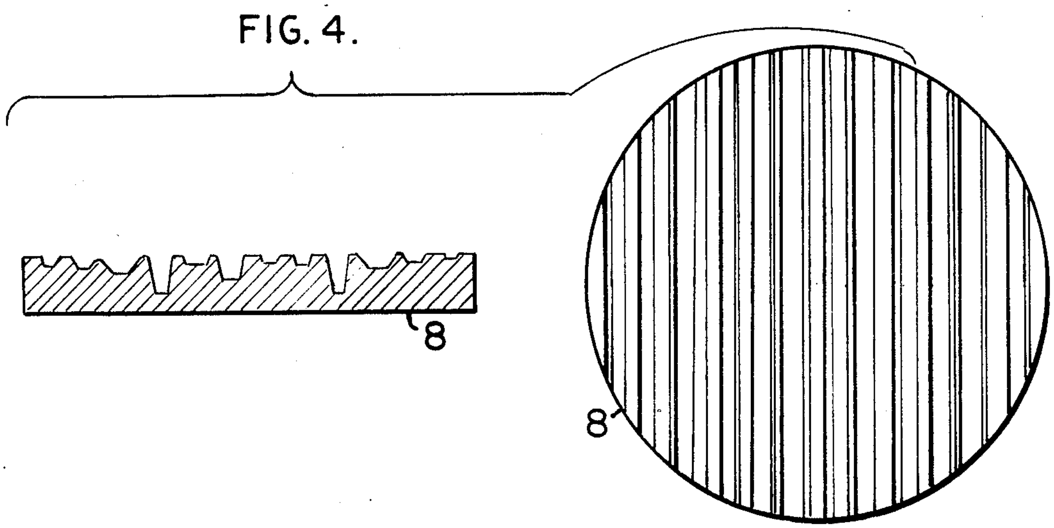
FIG. 4 shows a detailed sectional view of a secondary very high frequency diffractor (8) which may be used to supplement labyrinth 2. Here the set of chambers which cause the "diffraction" effect are of trapezoidal cross-section.
Figure 5:
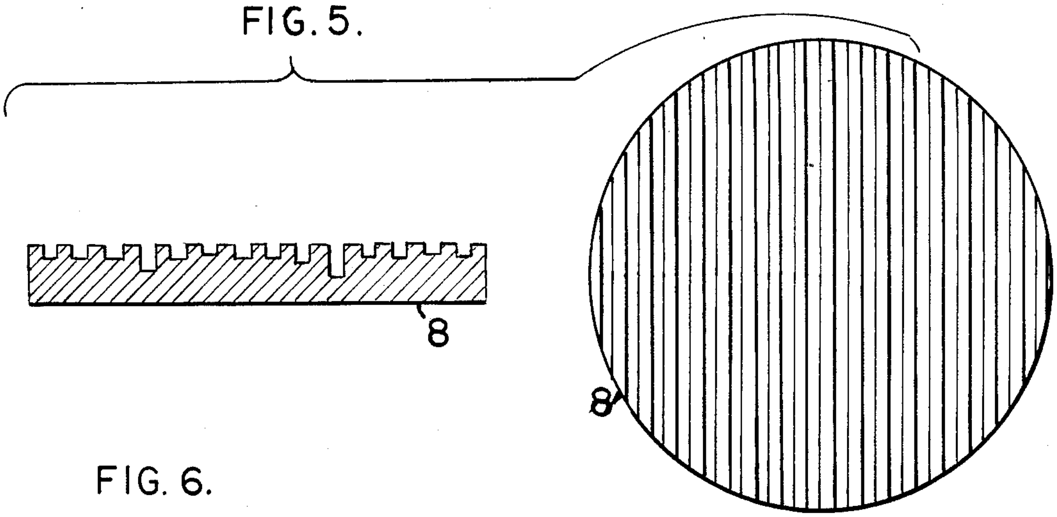
FIG. 5 shows a detailed sectional view of a secondary very high frequency diffractor (8) which may be used to supplement labyrinth 2. Here, the chambers are of rectangular crosssection.
Figure 6:
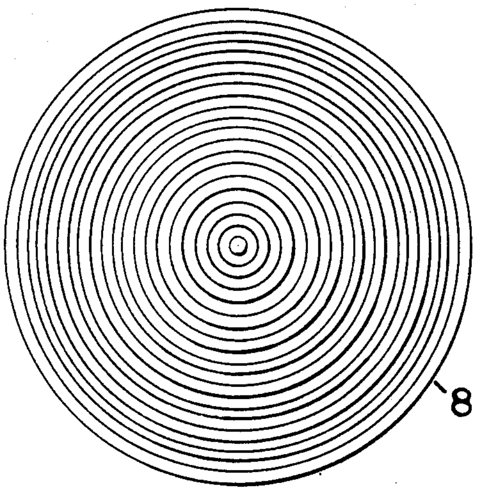
FIG. 6 shows a sectional view of a secondary very high frequency diffractor, showing by this example that the diffractor may be formed of concentric chambers.

It has been found that the diffraction effect is not dependent upon the labyrinth chambers being linear. The chambers can be bent and even folded. Hence, diffraction apparatus (1) utilizes this, thereby compacting the labyrinth to a smaller overall size and enabling a better utilization of the available space. Other configurations of the bent and folded labyrinth are feasible. Hence, the chambers can be fully linear as in (2) shown in detail in FIG. 3. They may be bent once and blocked off to form the appropriate depths to form a chevron. They may be bent and folded, as shown in FIG. 2. Furthermore, they need not necessarily be of rectilinear shape; they may have a triangular cross-section or any other geometric cross-section generating the desired resonant cavities. They may even be placed in concentric circular patterns as is shown in FIG. 6.

I claim:

1. An acoustic labyrinth for diffracting and thereby disbursing sound impinged thereupon from a sound source close thereto, comprising;

(a) a large plurality of adjacent elongated parallel channels, (b) each said adjacent elongated parallel channel having an entrance, and having nonuniformly varying depths, (c) the entrance to each said adjacent elongated parallel channel positioned in oblique alignment with respect to the direction of the depths of said elongated parallel channels, and (d) said sound source (3 and 4) closely adjacent to said elongated parallel channels to impinge sound upon said large plurality of channels.

2. The acoustic labyrinth of claim 1, in which;

(a) certain channels are bent in part and folded behind adjacent channels.

* * * * *